(12) United States Patent
Fink

(10) Patent No.: US 7,088,046 B2
(45) Date of Patent: Aug. 8, 2006

(54) INTEGRATED PROCESS TUBE AND ELECTROSTATIC SHIELD, ASSEMBLY THEREOF AND MANUFACTURE THEREOF

(75) Inventor: Steven T Fink, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/664,903

(22) Filed: Sep. 22, 2003

(65) Prior Publication Data

US 2004/0062021 A1 Apr. 1, 2004

Related U.S. Application Data

(60) Provisional application No. 60/414,420, filed on Sep. 30, 2002.

(51) Int. Cl.
*H01J 1/52* (2006.01)

(52) U.S. Cl. .......................................... 315/85; 361/816

(58) Field of Classification Search ........... 315/111.01, 315/111.21, 111.41, 85; 219/121.15, 121.21; 361/816

See application file for complete search history.

(56) References Cited

U.S. PATENT DOCUMENTS

| | | | | |
|---|---|---|---|---|
| 5,571,366 A * | 11/1996 | Ishii et al. | ............. | 156/345.26 |
| 5,647,913 A * | 7/1997 | Blalock | .................... | 118/723 I |
| 6,385,977 B1 * | 5/2002 | Johnson | ......................... | 62/64 |
| 6,511,577 B1 * | 1/2003 | Johnson | ................. | 156/345.48 |
| 6,630,364 B1 * | 10/2003 | Johnson | ....................... | 438/14 |
| 6,758,948 B1 * | 7/2004 | Johnson | ................. | 204/192.12 |
| 2002/0125223 A1 * | 9/2002 | Johnson et al. | ........ | 219/121.43 |

* cited by examiner

*Primary Examiner*—Thuy Vinh Tran
(74) *Attorney, Agent, or Firm*—Pillsbury Winthrop Shaw Pittman LLP

(57) ABSTRACT

A plasma reactor sub-assembly includes both an electrostatic shield and a process tube. Optionally, the electrostatic shield and the process tube are connected. Alternatively, they are configured to fit together without being physically connected. The sub-assembly may be manufactured using a process tube nested within the circumference of an electrostatic shield, an electrostatic shield patterned directly on a process tube using, for example, thin film deposition, or a process tube bonded or not bonded to an electrostatic shield made of a flexible, electrical film material.

21 Claims, 4 Drawing Sheets

INTEGRATED PROCESS TUBE AND ELECTROSTATIC SHIELD, ASSEMBLY THEREOF AND MANUFACTURE THEREOF

This non-provisional application claims the benefit of Provisional Application No. 60/414,420, filed Sep. 30, 2002, the contents of which are incorporated in their entirety herewith.

BACKGROUND OF THE INVENTION

1. Field of the Invention

The present invention relates to plasma processing systems, more particularly, the present invention relates to an Electrostatically Shielded Radio Frequency plasma reactor and a method for manufacturing the same.

2. Description of Related Art

In many material processing applications and in the manufacturing and processing of semiconductors, Integrated Circuits (IC), displays and other electrical devices, a plasma reacts, or facilitates a reaction, with a substrate, such as a semiconductor wafer. For example, in order to fabricate ICs with submicron features using etch and deposition processes, modern semiconductor processing systems may utilize plasma assisted techniques such as Reactive Ion Etching (RIE), Plasma Enhanced Chemical Vapor Deposition (PECVD), sputtering, reactive sputtering, and ion-assisted Plasma Vapor Deposition (PVD). In such known systems, a gas is introduced to a processing environment wherein a gas plasma is formed and maintained through the application of Radio Frequency (RF) power. To generate the plasma, power is supplied to a gas by an inductive or a capacitive plasma coupling element.

Conventionally, inductively coupled plasma reactors, specifically of the Electrostatically Shielded Radio Frequency (ESRF) type, generally include a plasma chamber located in a process tube. The plasma chamber is located in the center surrounded on the sides by the process tube. Located radially outside the process tube is an electrostatic shield, which can be a thin metal tube, conical or cylindrical in shape with longitudinal slots of some number around the periphery. A Radio Frequency (RF) coil is provided radially outward from the electrostatic shield.

In the electrostatic shield, variations in the number of slots, slot width and material thickness are possible and affect plasma starting and plasma chemistry in each process. Thus, when changes need to be made in these parameters the electrostatic shield may be replaced. Additionally, a normal occurrence in this type of reactor is cleaning and/or replacement of the process tube. While this cleaning/replacement operation also takes some period of time it is a necessary routine maintenance step that must be completed regularly.

SUMMARY OF THE INVENTION

In accordance with at least one embodiment of the invention, the process tube and electrostatic shield are configured to cooperate to form a sub-assembly that improves ease of insertion and removal of the electrostatic shield from the plasma reactor housing.

Furthermore, in accordance with at least one embodiment of the invention, the process tube and the electrostatic shield are formed integrally so as to provide a single part.

DETAILED DESCRIPTION OF EMBODIMENTS OF THE INVENTION

Figure 1:
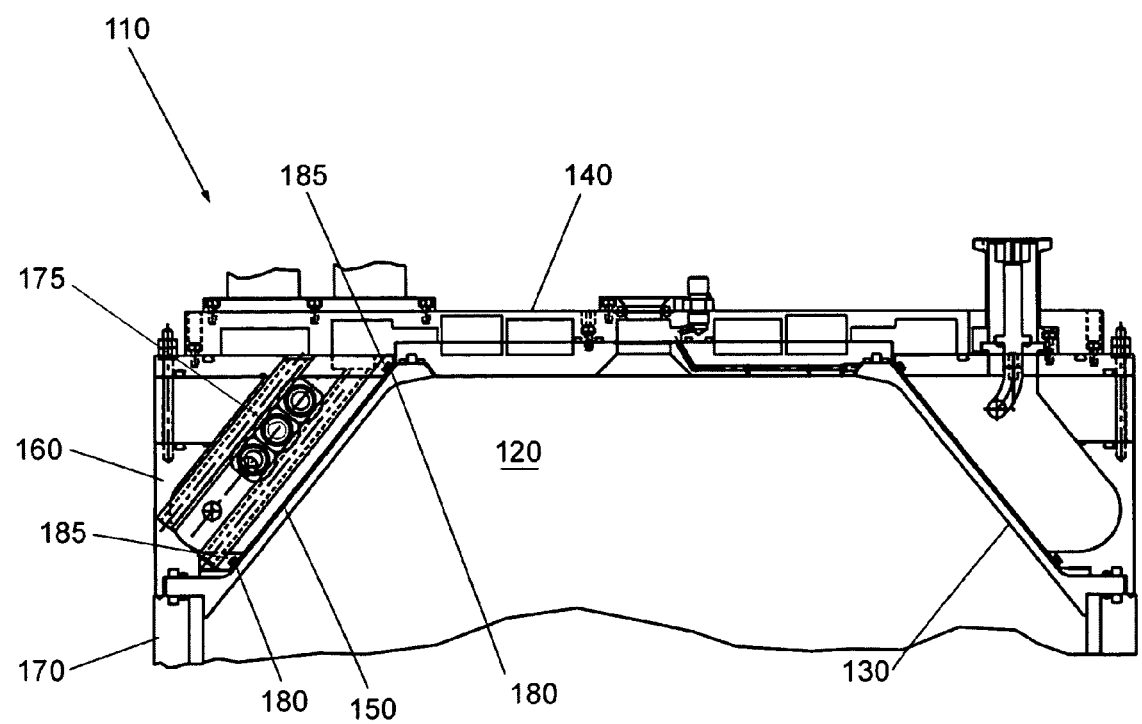
FIG. 1 illustrates a cross sectional view of the spira-shield in combination with the electrostatic shield and the housing in accordance with at least one embodiment of the invention.

In the embodiment illustrated in FIG. 1, a plasma reactor 110 includes a plasma chamber 120, process tube 130, inject assembly 140 and eletrostatic shield 150, housing 160 and process chamber 170. The plasma chamber 120 is located in the center of a plasma reactor surrounded on the sides by the process tube 130. Located directly outside the process tube 130 radially is the electrostatic shield 150. An RF coil 175 and associated parts are located within housing 160. The entire volume, inside the housing 160, including the electrostatic shield 150 and the outside surface of the process tube 130, is immersed in an insulating or dielectric fluid, which cools the assembly. The bottom of the entire assembly mates to the appropriate process chamber 170 on an etching machine. An open end of the process tube allows the chuck assembly of the machine (not shown) to move up towards this opening, and in some cases be located inside this opening.

In accordance with each of the embodiments of the invention, the electrostatic shield is grounded to the housing using a spira-shield, or the like. For example, a spira-shield 180 may be implemented as a wound spiral of plated metal that can provide high permeability magnetic shielding and physical protection for electrical wiring. The spira-shield can be grounded for electric-field shielding.

Figure 2:
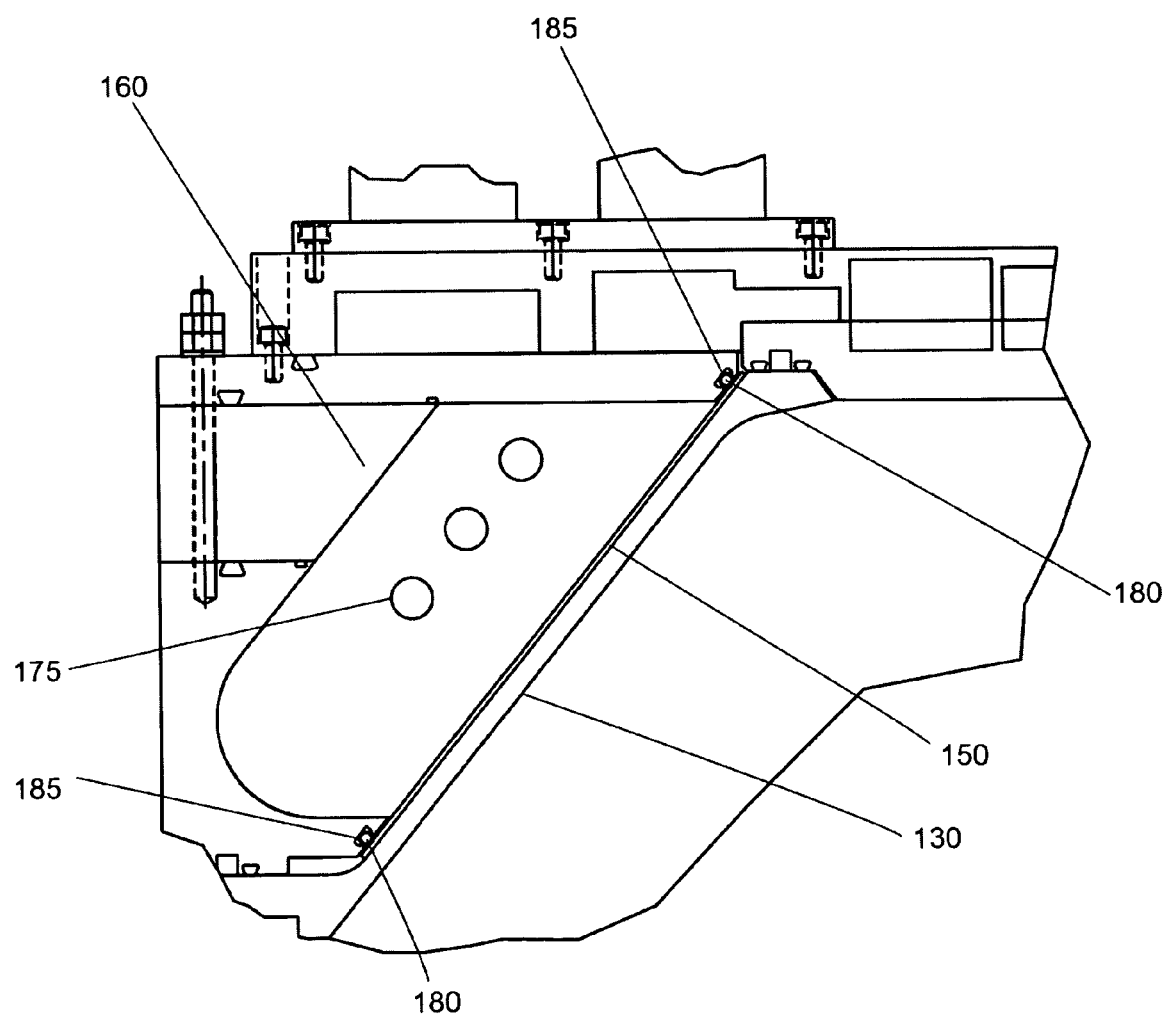
FIG. 2 illustrates expanded cross sectional view of the spira-shield in combination with the electrostatic shield and the housing.
Figure 3:
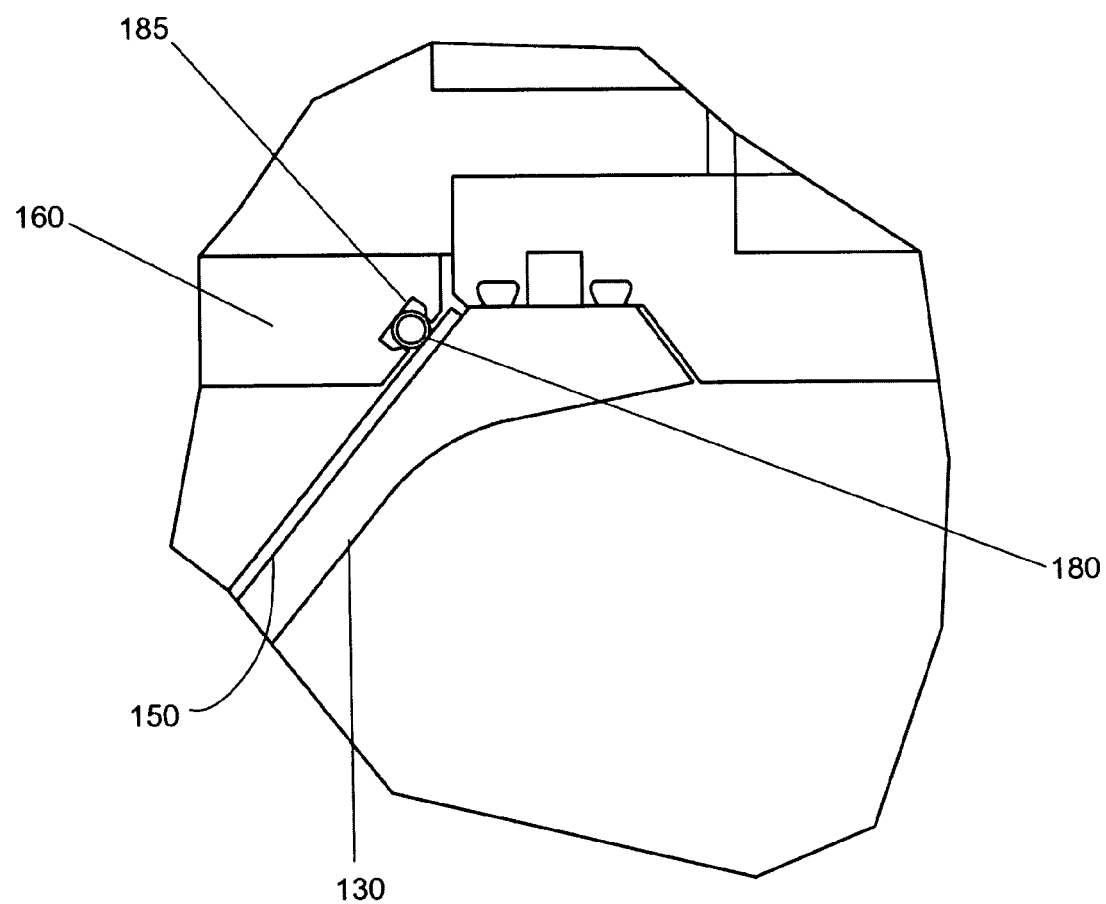
FIG. 3 illustrates another expanded cross sectional view of the spira-shield in combination with the electrostatic shield and the housing.
Figure 4:
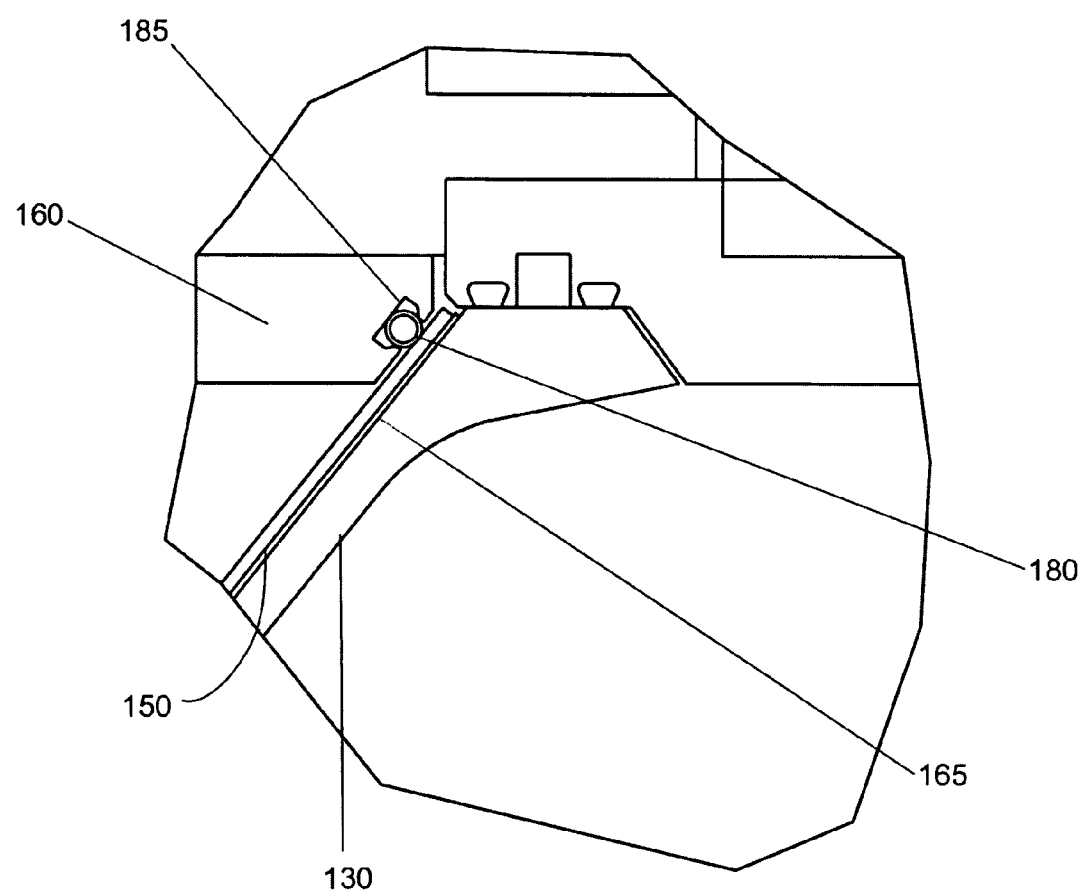
FIG. 4 illustrates another expanded cross sectional view of the spacers in combination with the electrostatic shield and the process tube.

As illustrated in FIG. 1, such a spira-shield 180 may be used to electrically couple the electrostatic shield 150 to the housing 160 by inserting the spira-shield 180 in radial grooves 185 (coupled to the housing 160) on both ends of the electrostatic shield 150 as illustrated in FIG. 1. Whatever the physical configuration of the process tube 130 and electrostatic shield 150 may be, the use of a spira-shield 180, or the like may allow for improved ease and speed in decoupling the electrostatic shield 150 from the housing 160. This allows for improved maintenance of the electrostatic shield 150 in relation to its positioning relative to the inject assembly 140, housing 160, and process chamber 170. FIG. 2 illustrates a portion of the cross section illustrated in FIG. 1, with greater detail. As shown in FIG. 2, the spira shield 180 couples the housing 160 and the electrostatic shield 150 at two different positions. FIG. 3 illustrates even greater detail of one of the positions of coupling the electrostatic shield 150 and the housing 160, indicating the spatial relationship between the spira-shield 180 and the radial groove 185 containing the spira shield 180. The configuration of the other position including the spira-shield 180 would be similar or identical to that illustrated in FIG. 3. In addition, FIG. 4 illustrates one of the positions for coupling the electrostatic shield 150 and the housing 160 and for using spacers 165 for coupling the electrostatic shield 150 to the process tube 130. FIG. 4 shows the spatial relationship between the spira-shield 180 and the radial groove 185 containing the spira shield 180, and the spatial relationship between the electrostatic shield 150, the process tube 130, and spacer 165.

In accordance with at least one embodiment of the invention, the process tube and the electrostatic shield are formed to be optionally coupled together prior to insertion of either part into the housing of the plasma reactor.

Various methods may be used to fabricate such a composite assembly. For example, one method for fabricating the composite assembly involves, first, manufacturing an electrostatic shield of metal. As explained above, the requisite electrical grounding will be provided via a spira-shield, which provides less need for machining and better contact completely around the top and bottom of the electrostatic shield. The electrostatic shield is then installed closely and concentrically over the process tube. The distance between the electrostatic shield and the process tube at their closest point may be, for example, around ⅜", with a maximum of one inch. This spacing may be implemented by installing spacers between the electrostatic shield and the process tube. Such spacers may be made of, for example, Teflon or any other insulating material.

In such a configuration, the electrostatic shield and the process tube are nested but not physically connected to form an electrostatic shield/process tube subassembly. The electrostatic shield may reside around the process tube and, at times of process tube removal, the electrostatic shield may be extracted along with the process tube. Other variations of the electrostatic shield, e.g., with different numbers of and configurations of slots, may then be substituted and the process tube and electrostatic shield may be replaced together. Also, the electrostatic shield may be attached to the process tube.

In at least one other embodiment of the invention, the electrostatic shield is patterned directly on the process tube using sputtering, evaporation or metal vapor deposition techniques, or the like. Additionally, subsequent plating processes may also be optionally used to increase thickness of the electrostatic-shield, which has an affect on the plasma.

Implementation of both of the above-described embodiments is feasible on process tubes that are cylindrical or conical or combinations of those shapes. Process tubes that include complex combinations of these shapes and others may be more practical with the embodiment involving patterning of the electrostatic shield on the process tube.

Potentially, cost associated with implementing the above-described embodiments are comparable with one another. That is, although depositing metal directly on a process tube to form a composite assembly may result in a more expensive part than a sub-assembly including both the process tube and the electrostatic shield, the cost of a corresponding conventional electrostatic shield would disappear as well. Therefore, total costs either way, would be similar.

In accordance with at least another embodiment of the invention, the electrostatic shield could also be made from a flex-print type of material, for example, Kapton® polyimide film, or a similar material. In such an embodiment, the electrostatic shield pattern could be implemented between two sheets of the film except on the top and bottom to allow for contacts with the spira-shield. Further the electrostatic shield could be bonded, e.g., in a way that would allow for differing thermal coefficients of the materials, or not bonded, to the process tube.

What is claimed is:

1. An assembly configured to be coupled to components of a plasma reactor, the assembly comprising:
   an electrostatic shield;
   at least one spira-shield electrically connected to the electrostatic shield; and
   a process tube,
   wherein the electrostatic shield is coupled to the process tube such that the electrostatic shield resides around the process tube and, at times of process tube removal from the plasma reactor, the electrostatic shield is extracted with the process tube, and
   wherein the at least one spira-shield grounds the electrostatic shield.

2. The assembly of claim 1, wherein the electrostatic shield is attached to the process tube.

3. The assembly of claim 1, wherein the process tube is coupled to the electrostatic shield such that the process tube positions the electrostatic shield within the plasma reactor.

4. An assembly configured to be coupled to components of a plasma reactor, the assembly comprising:
   an electrostatic shield; p1 at least one spira-shield electrically coupled to the electrostatic shield; and
   a process tube,
   wherein the electrostaic shield is coupled to the process tube such that the electrostatic shield resides around the process tube and, at times of process tube removal from the plasma reactor, the electrostatic shield is extracted with the process tube.

5. An assembly configured to be coupled to components of a plasma reactor, the assembly comprising:
   an electrostatic shield;
   a process tube,
   wherein the electrostatic shield is coupled to the process tube such that the electrostatic shield resides around the process tube and, at times of process tube removal from the plasma reactor, the electrostatic shield is extracted with the process tube; and
   at least one insulating spacer located between the electrostatic shield and an end of the process tube.

6. The assembly of claim 5, wherein the at least one insulating spacer positions the electrostatic shield front the process tube, at their closest point, by a maximum distance of one inch.

7. The assembly of claim 5, wherein the at least one insulating spacer positions the electrostatic shield from the process tube, at their closest point, by approximately ⅜of an inch.

8. An assembly configured to be coupled to components of a plasma reactor, the assembly comprising:
   a process tube and
   an electrostatic shield patterned directly on the process tube.

9. The assembly of claim 8, wherein the electrostatic shield is patterned directly on the process tube using at least one of sputtering, evaporation or metal vapor deposition.

10. The assembly of claim 9, wherein the electrostatic shield is patterned on the process tube also using a plating process that increases a thickness of the electrostatic-shield.

11. An assembly configured to be coupled to components of a plasma reactor, the assembly comprising:
   a process tube;
   an electrostatic shield patterned directly on the process tube; and
   at least one spira-shield electrically coupled to the electrostatic shield.

12. An assembly configured to be coupled to components of a plasma reactor, the assembly comprising:
 a process tube;
 an electrostat shield made from a flex-print material; and
 at least one spira-shield electrically connected to the electrostatic shield,
 wherein the electrostatic shield is coupled to the process tube such that the electrostatic shield resides around the process tube and, at times of process tube removal from the plasma reactor, the electrostatic shield is extracted with the process tube, and
 wherein the at least one spira-shield grounds the electrostatic shield.

13. The assembly of claim 12, wherein the flex-print material is a polyimide film.

14. The assembly of claim 12, wherein the electrostatic shield and the process tube are bonded together.

15. The assembly of claim 12, wherein the process tube is coupled to the electrostatic shield such that the process tube positions the electrostatic shield within the plasma reactor.

16. An assembly configured to be coupled to components of a plasma reactor, the assembly comprising:
 a process tube; and
 an electrostatic shield made from a flex-print material,
 wherein the electrostatic shield is coupled to the process tube such that the electrostatic shield resides around the process tube and, at times of process tube removal from the plasma reactor, the electrostatic shield is extracted with the process tube, and
 wherein the electrostatic shield is implemented between two sheets of the flex-print material except on a top and bottom to allow for contacts with a spira-shield.

17. An assembly configured to be coupled to components of a plasma reactor the assembly comprising:
 a process tube;
 an electrostatic shield made from a flex-print material; and
 at least one spira-shield electrically coupled to the electrostatic shield, wherein the electrostatic shield is coupled to the process tube such that the electrostatic shield resides around the process tube and, at times of process tube removal from the plasma reactor, the electrostatic shield is extracted with the process tube.

18. A method of fabricating an assembly including a housing, a process tube and an electrostatic shield, the method comprising:
 coupling the process tube to an electrostatic shield, within the electrostatic shield, to form the assembly; and
 electrically coupling the electrostatic shield to a housing through a spira-shield.

19. A method of fabricating an assembly including both a process tube and an electrostatic shield, the method comprising:
 providing a the process tube; and
 patterning the electrostatic shield onto the process tube using at least one of sputtering, evaporation or metal vapor deposition.

20. The method of claim 19, wherein the patterning includes a plating process that increases a thickness of the electrostatic-shield.

21. A method of fabricating an assembly including both a process tube and an eletrostatic shield, the method comprising:
 providing a the process tube;
 patterning the electrostatic shield onto the process tube using at least one of sputtering, evaporation or metal vapor deposition; and
 electrically coupling the electrostatic shield to at least one spira-shield.

* * * * *